United States Patent
Fox et al.

(10) Patent No.: US 6,597,028 B2
(45) Date of Patent: Jul. 22, 2003

(54) CAPACITIVELY COUPLED FERROELECTRIC RANDOM ACCESS MEMORY CELL AND A METHOD FOR MANUFACTURING THE SAME

(75) Inventors: Glen Fox, Colorado Springs, CO (US); Thomas Evans, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/873,772

(22) Filed: Jun. 4, 2001

(65) Prior Publication Data

US 2002/0000586 A1 Jan. 3, 2002

Related U.S. Application Data

(60) Provisional application No. 60/214,207, filed on Jun. 26, 2000.

(51) Int. Cl.[7] .............. H01C 29/74; H01C 29/96; H01C 31/062; H01C 31/113; H01C 31/119
(52) U.S. Cl. .............. 257/295; 257/296; 257/309; 257/310; 257/532
(58) Field of Search .............. 257/296, 295, 257/307, 306, 310

(56) References Cited

U.S. PATENT DOCUMENTS

| | | | |
|---|---|---|---|
| 5,757,042 A | 5/1998 | Evans, Jr. et al. | |
| 5,852,307 A | * 12/1998 | Aoyama et al. | 257/295 |
| 5,864,932 A | 2/1999 | Evans et al. | |
| 5,920,453 A | 7/1999 | Evans et al. | |
| 5,959,879 A | 9/1999 | Koo | |
| 5,977,577 A | 11/1999 | Evans, Jr. | |
| 5,978,253 A | 11/1999 | Lee et al. | |
| 5,990,513 A | 11/1999 | Perino et al. | |
| 6,027,947 A | * 2/2000 | Evans et al. | 438/3 |
| 6,046,469 A | * 4/2000 | Yamazaki et al. | 257/306 |
| 6,066,868 A | 5/2000 | Evans, Jr. | |
| 6,121,648 A | 9/2000 | Evans, Jr. | |
| 6,150,184 A | 11/2000 | Evans et al. | |
| 6,174,735 B1 | 1/2001 | Evans | |
| 6,190,926 B1 | 2/2001 | Perino et al. | |
| 6,194,751 B1 | 2/2001 | Evans, Jr. | |
| 6,201,271 B1 | * 3/2001 | Okutoh et al. | 257/295 |
| 6,201,726 B1 | 3/2001 | Evans | |
| 6,211,542 B1 | 4/2001 | Eastep | |
| 6,225,656 B1 | * 5/2001 | Cuchiaro et al. | 257/295 |
| 6,242,299 B1 | 6/2001 | Hickert | |
| 6,249,014 B1 | 6/2001 | Bailey | |
| 6,258,658 B1 | 7/2001 | Bohm et al. | |
| 6,281,023 B2 | 8/2001 | Eastep et al. | |
| 6,281,535 B1 | * 8/2001 | Ma et al. | 257/395 |
| 6,313,539 B1 | * 11/2001 | Yokoyama et al. | 257/761 |
| 6,348,709 B1 | * 2/2002 | Graettinger et al. | 257/311 |
| 6,395,612 B1 | * 5/2002 | Amanuma | 438/393 |
| 6,407,422 B1 | * 6/2002 | Asano et al. | 257/306 |
| 6,414,344 B1 | * 7/2002 | Kweon | 257/295 |
| 6,462,931 B1 | * 10/2002 | Tang et al. | 361/305 |

* cited by examiner

*Primary Examiner*—Eddie Lee
*Assistant Examiner*—Jesse A. Fenty
(74) *Attorney, Agent, or Firm*—Hogan & Hartson L.L.P.

(57) ABSTRACT

A ferroelectric memory cell includes a ferroelectric capacitor including a bottom electrode, a ferroelectric layer formed on the bottom electrode and a top electrode formed on the ferroelectric layer, a high permittivity dielectric layer formed over the ferroelectric capacitor, wherein the high permittivity dielectric layer includes an encapsulation layer and completely covers the top electrode, and a local interconnect electrode formed on the encapsulation layer.

26 Claims, 3 Drawing Sheets

CAPACITIVELY COUPLED FERROELECTRIC RANDOM ACCESS MEMORY CELL AND A METHOD FOR MANUFACTURING THE SAME

CROSS REFERENCE TO RELATED APPLICATIONS

This application claims benefit of U.S. Provisional Patent Application No. 60/214,207, entitled Capacitively-Coupled Ferroelectric Random Access Memory Cell with Capacitor over Plug Architecture, filed Jun. 26, 2000 which is hereby incorporated by reference.

BACKGROUND OF THE INVENTION

1. Field of the Invention

The present invention relates to a ferroelectric random access memory and more particularly, to a capacitively coupled ferroelectric random access memory cell and a method for manufacturing the same.

2. Discussion of the Related Art

FRAM (ferroelectric random access memory) is a type of non-volatile read/write random access semiconductor memory. FRAM combines the advantages of SRAM (static random access memory) with its fast writing speed, and EAROM (electrically alterable read-only memory) with its non-volatility and in-circuit programmability.

A ferroelectric memory cell consists of a ferroelectric capacitor and a transistor. The properties of a dielectric material in the FRAM provide special advantages. The dielectric material has a high dielectric constant and can be polarized by an electric field. The polarization remains until it is reversed by an opposite electrical field. This makes the memory non-volatile.

A goal in designing a non-volatile ferroelectric random access memory is to realize a small die and high speed read/write at low supply voltage.

SUMMARY OF THE INVENTION

Accordingly, the present invention is directed to an improved ferroelectric random access memory.

An object of the present invention is to provide a ferroelectric random access memory cell including a ferroelectric capacitor having fast switching speeds.

Another object of the present invention is to provide a ferroelectric capacitor with a high charge storage capability.

Another object of the present invention is to provide a ferroelectric capacitor that has low leakage current and relatively linear capacitance dependence on voltage.

Another object of the present invention is to provide a simplifier manufacturing process of a ferroelectric random access memory cell.

Another object of the present invention is to provide a ferroelectric memory cell including a ferroelectric capacitor that is driven by capacitive coupling.

Additional features and advantages of the invention will be set forth in the description, which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a ferroelectric memory cell includes a ferroelectric capacitor including a bottom electrode, a ferroelectric layer formed on the bottom electrode and a top electrode formed on the ferroelectric layer, a high permittivity dielectric layer formed over the ferroelectric capacitor, wherein the high permittivity dielectric layer includes an encapsulation layer and completely covers the top electrode, and a local interconnect electrode formed on the encapsulation layer.

In another aspect of the present invention, an integrated circuit includes a ferroelectric capacitor including a bottom electrode, a ferroelectric layer formed on the bottom electrode and a top electrode formed on the ferroelectric layer, a high permittivity dielectric layer formed over the ferroelectric capacitor, wherein the high permittivity dielectric layer includes an encapsulation layer and completely covers the top electrode, and a local interconnect electrode formed on the encapsulation layer.

In another aspect of the present invention, a method for forming an integrated circuit includes forming a ferroelectric capacitor, wherein the ferroelectric capacitor includes a bottom electrode, a ferroelectric layer formed on the bottom electrode and a top electrode formed on the ferroelectric layer, forming a high permittivity dielectric layer over the ferroelectric capacitor, wherein the high permittivity dielectric layer includes an encapsulation layer and completely covers the top electrode, and forming a local interconnect electrode on the encapsulation layer so that the top electrode, the encapsulation layer and the local interconnect electrode form a second capacitor.

In another aspect of the present invention, a ferroelectric memory cell includes a conductive barrier, a ferroelectric capacitor formed on the conductive barrier, wherein the ferroelectric capacitor includes a bottom electrode, a ferroelectric layer formed on the bottom electrode and a top electrode formed on the ferroelectric layer, and a high permittivity dielectric layer formed between the conductive barrier and the ferroelectric capacitor, wherein the conductive barrier connects the ferroelectric capacitor to an underlying device through a connecting electrode formed directly below the ferroelectric capacitor.

In another aspect of the present invention, an integrated circuit includes a conductive barrier, a ferroelectric capacitor formed on the conductive barrier, wherein the ferroelectric capacitor includes a bottom electrode, a ferroelectric layer formed on the bottom electrode and a top electrode formed on the ferroelectric layer, and a high permittivity dielectric layer formed between the conductive barrier and the ferroelectric capacitor, wherein the conductive barrier connects the ferroelectric capacitor to an underlying device through a connecting electrode formed directly below the ferroelectric capacitor.

In another aspect of the present invention, a method for forming an integrated circuit includes forming a conductor, forming a conductive barrier on the conductor, forming a high permittivity dielectric layer on the conductive barrier, and forming a ferroelectric capacitor on the high permittivity dielectric layer, wherein the ferroelectric capacitor includes a bottom electrode, a ferroelectric layer formed on the bottom electrode and a top electrode formed on the ferroelectric layer, wherein the conductive barrier connects the ferroelectric capacitor to an underlying device through the conductor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
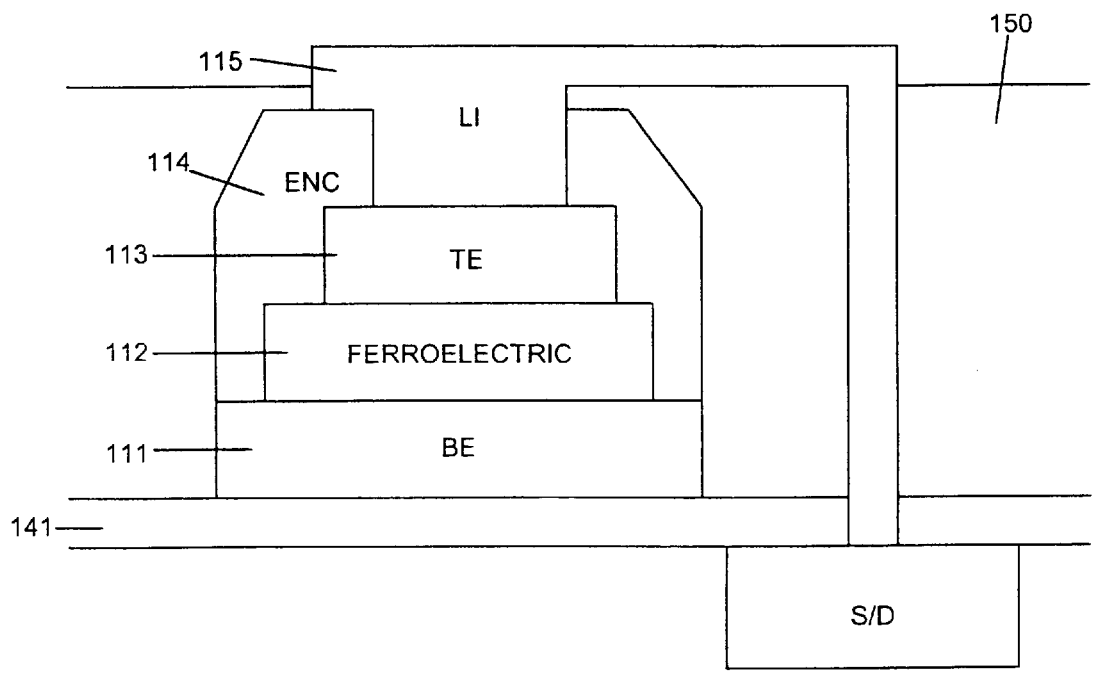
FIG. 1 is a cross sectional view of related art ferroelectric memory cell.

FIG. 1 shows a cross sectional view of a ferroelectric memory cell structure including a ferroelectric capacitor. The ferroelectric capacitor includes a bottom electrode 111, a ferroelectric thin film layer 112, and a top electrode 113. The ferroelectric capacitor is formed on an underlying layer 141, and an encapsulation layer 114 is formed over the ferroelectric capacitor to protect the ferroelectric capacitor from being damaged during etching of the bottom electrode 111. An interlevel dielectric layer 150 is deposited thereafter, and then the interlevel dielectric layer 150 and the encapsulation layer 114 are etched to form an opening so that a local interconnect electrode 115 can be formed to be in contact with the top electrode 113 through the opening.

Figure 2:
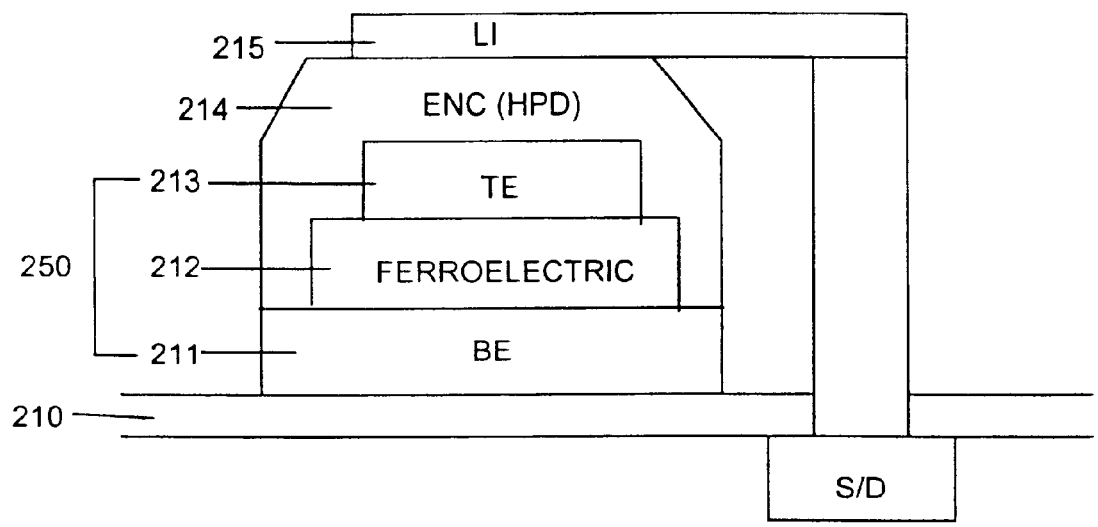
FIG. 2 is a cross sectional view of a ferroelectric memory cell accordingly to a first embodiment of the present invention.

FIG. 2 shows a cross sectional view of a ferroelectric memory cell according to a first embodiment of the present invention.

The ferroelectric memory cell shown in FIG. 2 includes a ferroelectric capacitor 250 formed on an underlayer of an integrated circuit. The ferroelectric capacitor includes a bottom electrode 211 and a top electrode 213 with a ferroelectric thin film layer 212 formed between. Preferable, the ferroelectric thin film layer 212 is formed of a ferroelectric material having a ceramic ferroelectric with a perovskite structure, such as PZT (lead zirconate titanate) or PLZT (lead lanthanum zirconate titanate). In this embodiment, as an example, PZT is used to form the ferroelectric thin film layer 212 (hereinafter PZT-F layer). The ferroelectric memory cell is formed by forming the bottom electrode 211 on a CMOS underlayer coated with $SiO_2$ or other interlayer dielectric layer 210 of an integrated circuit. Thereafter, the PZT-F layer 212 is formed on the bottom electrode 211 and the top electrode 213 is formed on the PZT-F layer 212, consecutively. Thereafter, an encapsulation layer 214 formed of a high permittivity dielectric (HPD) is formed to cover and protect the underlying ferroelectric capacitor 250 from being damaged during etching of the bottom electrode 211. Then, a local interconnect electrode 215 is formed on the encapsulation layer 214 to connect the ferroelectric capacitor to a source/drain of a transistor.

Effectively, the ferroelectric memory cell in this embodiment includes two capacitors in series—the ferroelectric capacitor 250 and a second capacitor including the top electrode 213, the encapsulation layer 214, and the local interconnect electrode 215. The ferroelectric capacitor 250 switches under the applied voltage, while the second capacitor does not. The second capacitor is formed to have a capacitance that is 5 to 10 times larger than a capacitance of the ferroelectric capacitor 250 by varying a thickness, an area, or a dielectric permittivity of the encapsulation layer 214. However, in order to reduce restrictions on the thickness and the area of the encapsulation layer, the encapsulation layer 214 should have a dielectric permittivity that is 5 to 10 times larger than that of the PZT-F layer 212. With such a capacitance ratio between the ferroelectric capacitor and the second capacitor, most of the voltage drop is across the ferroelectric capacitor 250.

In this embodiment, the encapsulation layer 214 formed of high permittivity dielectric is used to form the second capacitor having a high charge storage capability that has low leakage current and relatively linear capacitance dependence on voltage. The high permittivity dielectric may be formed of PZT with a lower Pb concentration than that of the PZT-F layer 212, which can provide a film with reduced leakage current without a dramatic decrease in permittivity. Also, the high permittivity dielectric may be formed by plasma damaging a PZT layer during etching processes of the top electrode, the bottom electrode, the PZT-F layer, and the encapsulating layer. The plasma damage can improve the linear dielectric performance of the encapsulating layer. Additionally, deposition of the high permittivity dielectric at elevated temperatures up to 700° C. can provide enhanced linear dielectric response and reduced leakage current. Furthermore, in addition to using different processes for forming the high permittivity dielectric and the PZT-F layer, the high permittivity dielectric may be formed of different compositions, which may include changes in Pb (lead), Zr (zirconium), and Ti (titanium) concentrations, as well as dopant concentrations, such as Ca (Calcium), Sr (Strontium), and La (lanthanum).

Figure 3:
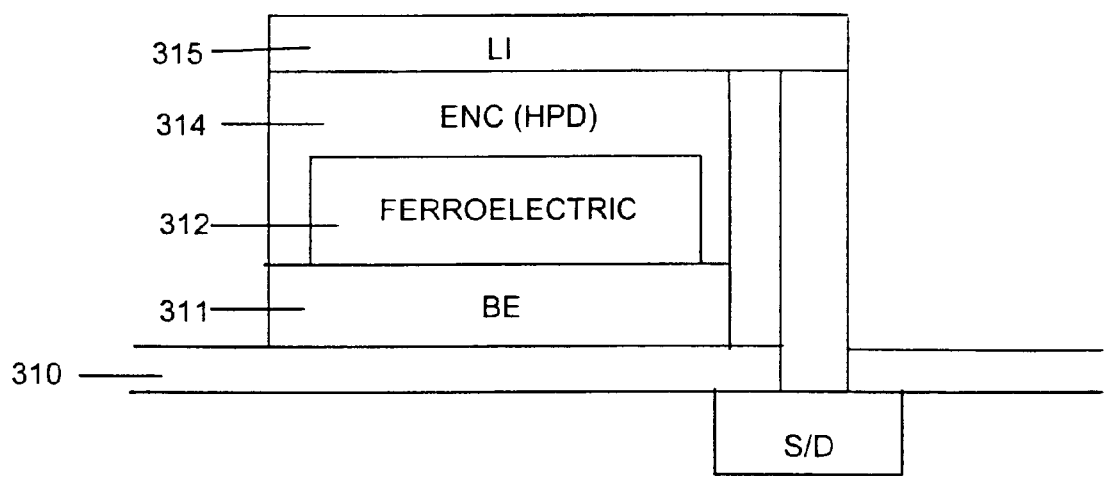
FIG. 3 is a cross sectional view of a ferroelectric memory cell showing an alternative structure in the first embodiment of the present invention.

Alternately, a very thin layer of electrode may be used for the top electrode 213. Furthermore, the top electrode of the ferroelectric capacitor 250 may be completely eliminated as shown in FIG. 3. Without the top electrode, a top interface of the PZT-F layer is no longer controlled by a ferroelectric/conductor interface. A dielectric/dielectric interface can provide better process stability with respect to the ferroelectric properties.

Figure 4:
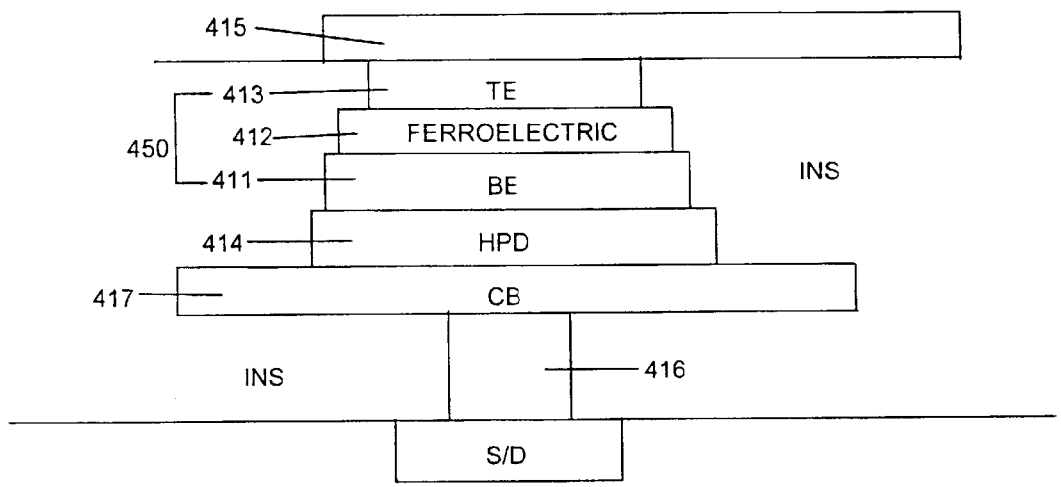
FIG. 4 is a cross sectional view of a ferroelectric memory cell accordingly to a second embodiment of the present invention.

FIG. 4 shows a cross sectional view of a ferroelectric random access memory cell according to a second embodiment of the present invention. In this embodiment, a ferroelectric capacitor is formed on a high permittivity dielectric layer. Additionally, the ferroelectric capacitor is formed directly over a connecting electrode that connects the ferroelectric capacitor to an underlying CMOS.

The ferroelectric memory cell shown in FIG. 4 is formed by forming a connecting electrode 416 on a source/drain region of a transistor, and forming a conductive barrier 417 thereon. Thereafter, a high permittivity dielectric layer 414 is formed on the conductive barrier 417, and a ferroelectric capacitor 450 is formed on the high permittivity dielectric layer 414. The ferroelectric capacitor 450 includes a bottom electrode 411, a ferroelectric thin film layer 412 (PZT-F layer, for example), and a top electrode 413. Then, a metalization layer 415 is formed on the ferroelectric capacitor 450.

Effectively, the ferroelectric memory cell in this embodiment includes two capacitors in series—the ferroelectric capacitor 450 and a second capacitor including the conductive barrier 417, the high permittivity dielectric layer 414, and the bottom electrode 411. The ferroelectric capacitor 450 switches under the applied voltage, while the second capacitor does not switch under the applied voltage. The second capacitor is formed to have a capacitance that is 5 to 10 times larger than a capacitance of the ferroelectric capacitor by varying a thickness, an area, or a dielectric permittivity of the high permittivity dielectric layer 414. In order to reduce restrictions on the thickness and the area of the high permittivity dielectric layer, a dielectric permittivity of the high permittivity dielectric layer should be 5 to 10 times that of the PZT-F layer. With this capacitance ratio, the most of the voltage drop is across the ferroelectric capacitor.

In this embodiment, by placing the high permittivity dielectric layer between the conducting barrier and the ferroelectric capacitor, an extra barrier material is included in the structure and the processing constraints on the barrier/BE interface can be reduced. Furthermore, by forming the ferroelectric capacitor directly over the connecting electrode 416 that connects the ferroelectric capacitor to the underlying CMOS, a size of the ferroelectric memory cell is reduced.

Figure 5:
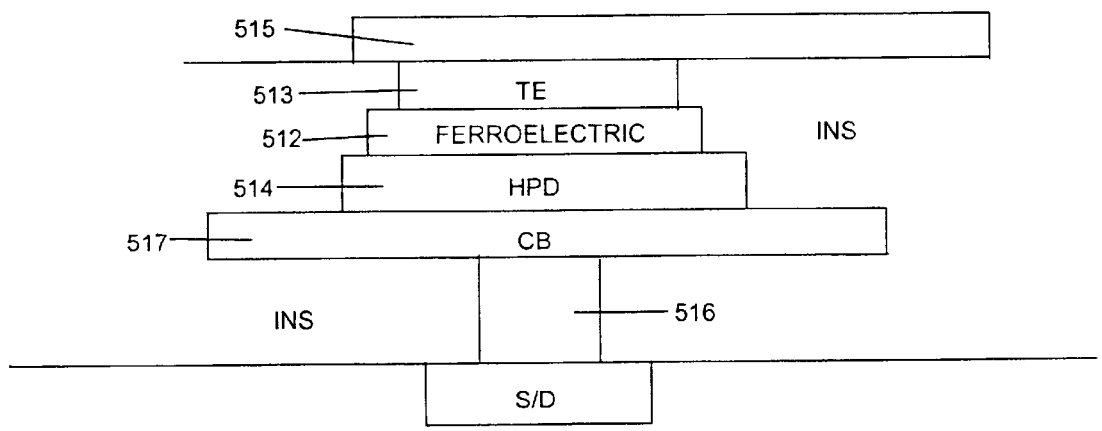
FIG. 5 is a cross sectional view of a ferroelectric memory cell showing an alternative structure in the second embodiment of the present invention.

Alternately, a very thin layer of electrode may be used for the bottom electrode 411. Furthermore, the bottom electrode may be completely eliminated as shown in FIG. 5. Without the bottom electrode, the bottom interface of the PZT-F layer 412 is no longer controlled by a ferroelectric/conductor interface. A dielectric/dielectric interface can provide better process stability with respect to the ferroelectric properties.

In the present invention, a capacitive coupling is used to provide the required switching voltage for a ferroelectric capacitor. The ferroelectric capacitor is driven by the capacitive coupling. Since a total capacitance of the ferroelectric memory cell is reduced, a RC time constant for a circuit is reduced and the ferroelectric capacitor can be switched at higher speeds. Further, by using the encapsulation layer formed of a high permittivity dielectric, a capacitor with a high storage capability can be formed. Furthermore, by a process wherein the encapsulation layer for the ferroelectric capacitor is not etched, the encapsulation layer can provide better protection of the underlying ferroelectric capacitor and a manufacturing process is simplified. Additionally, by forming the ferroelectric capacitor directly over the connecting electrode, a size of the ferroelectric memory cell can be reduced, and by placing the high permittivity dielectric layer between the conducting barrier and the ferroelectric capacitor, the processing constraints on the conducting barrier/bottom electrode interface can be relaxed.

It will be apparent to those skilled in the art that various modifications and variations can be made in the capacitively coupled ferroelectric random access memory cell of the present invention without departing from the spirit or scope of the invention. Thus, it is intended that the present invention covers the modifications and variations of this invention if they come within the scope of any claims and their equivalents.

What is claimed is:

1. A ferroelectric memory cell comprising:
   a ferroelectric capacitor including a bottom electrode, a ferroelectric layer formed on the bottom electrode and a top electrode formed on the ferroelectric layer;
   a high permittivity dielectric layer formed over the ferroelectric capacitor, wherein the high permittivity dielectric layer comprises an encapsulation layer and completely covers the top electrode; and
   a local interconnect electrode formed on the encapsulation layer and capacitively coupled to the top electrode.

2. The ferroelectric memory cell according to claim 1, wherein a dielectric permittivity of the encapsulation layer is 5 to 10 times larger than a dielectric permittivity of the ferroelectric layer.

3. The ferroelectric memory cell according to claim 1, wherein the ferroelectric layer includes a first PZT.

4. The ferroelectric memory cell according to claim 3, wherein the encapsulation layer includes a second PZT, and a Pb (lead) of the second PZT is lower than that of the first PZT.

5. The ferroelectric memory cell according to claim 3, wherein the encapsulation layer includes a second PZT, and the second PZT has a different concentration of Pb (lead), Zr (zirconate) or Ti (titanate) than that of the first PZT.

6. The ferroelectric memory cell according to claim 1, wherein the top electrode, the encapsulation layer and the local interconnect electrode comprise a second capacitor.

7. The ferroelectric memory cell according to claim 6, wherein a capacitance of the second capacitor is 5 to 10 times larger than a capacitance of the ferroelectric capacitor.

8. The ferroelectric memory cell according to claim 6, wherein the second capacitor has high charge storage capability.

9. The ferroelectric memory cell according to claim 1, further comprising a transistor, wherein the transistor is connected to the local interconnect electrode.

10. An integrated circuit comprising:
    a ferroelectric capacitor including a bottom electrode, a ferroelectric layer formed on the bottom electrode and a top electrode formed on the ferroelectric layer;
    a high permittivity dielectric layer formed over the ferroelectric capacitor, wherein the high permittivity dielectric layer comprises an encapsulation layer and completely covers the top electrode; and
    a local interconnect electrode formed on the encapsulation layer and capacitively coupled to the top electrode.

11. The integrated circuit according to claim 10, wherein a dielectric permittivity of the encapsulation layer is 5 to 10 times larger than a dielectric permittivity of the ferroelectric layer.

12. The integrated circuit according to claim 10, wherein the top electrode, the encapsulation layer and the local interconnect electrode comprise a second capacitor.

13. The integrated circuit according to claim 12, wherein a capacitance of the second capacitor is 5 to 10 times larger than a capacitance of the ferroelectric capacitor.

14. A ferroelectric memory cell comprising:
    a conductive barrier;
    a ferroelectric capacitor formed on the conductive barrier, wherein the ferroelectric capacitor includes a bottom electrode, a ferroelectric layer formed on the bottom electrode and a top electrode formed on the ferroelectric layer; and
    a high permittivity dielectric layer formed between the conductive barrier and the ferroelectric capacitor, wherein the conductive barrier connects the ferroelectric capacitor to an underlying device through a connecting electrode formed directly below the ferroelectric capacitor.

15. The ferroelectric memory cell according to claim 14, wherein a dielectric permittivity of the high permittivity dielectric layer is 5 to 10 times larger than a dielectric permittivity of the ferroelectric layer.

16. The ferroelectric memory cell according to claim 14, wherein the ferroelectric layer includes a first PZT.

17. The ferroelectric memory cell according to claim 16, wherein the high permittivity dielectric layer includes a second PZT, and a Pb (lead) concentration of the second PZT is lower than that of the first PZT.

18. The ferroelectric memory cell according to claim 16, wherein the high permittivity dielectric layer includes a second PZT, and the second PZT has a different concentration of Pb (lead), Zr (zirconate) or Ti (titanate) than that of the first PZT.

19. The ferroelectric memory cell according to claim 14, wherein the bottom electrode, the high permittivity dielectric layer and the conductive layer comprise a second capacitor.

20. The ferroelectric memory cell according to claim 19, wherein a capacitance of the second capacitor is 5 to 10 times larger than a capacitance of the ferroelectric capacitor.

21. The ferroelectric memory cell according to claim 14, wherein the ferroelectric capacitor is driven by a capacitive coupling.

22. The ferroelectric memory cell according to claim 14, further comprising a metalization layer formed on the ferroelectric capacitor.

23. An integrated circuit comprising:

a conductive barrier;

a ferroelectric capacitor formed on the conductive barrier, wherein the ferroelectric capacitor includes a bottom electrode, a ferroelectric layer formed on the bottom electrode and a top electrode formed on the ferroelectric layer; and a high permittivity dielectric layer formed between the conductive barrier and the ferroelectric capacitor, wherein the conductive barrier connects the ferroelectric capacitor to an underlying device through a connecting electrode formed directly below the ferroelectric capacitor.

24. The integrated circuit according to claim 23, wherein a dielectric permittivity of the high permittivity dielectric layer is 5 to 10 times larger than a dielectric permittivity of the ferroelectric layer.

25. The integrated circuit according to claim 23, wherein the bottom electrode, the high permittivity dielectric layer and the conductive layer comprise a second capacitor.

26. The integrated circuit according to claim 25, wherein a capacitance of the second capacitor is 5 to 10 times larger than a capacitance of the ferroelectric capacitor.

* * * * *